United States Patent
Chang et al.

(10) Patent No.: US 8,410,531 B2
(45) Date of Patent: Apr. 2, 2013

(54) THIN FILM TRANSISTOR HAVING SCHOTTKY BARRIER

(75) Inventors: Ming-Tse Chang, Taipei (TW); Chun-Wei Su, Taipei County (TW)

(73) Assignee: Chunghwa Picture Tubes, Ltd., Bade, Taoyuan (TW)

( * ) Notice: Subject to any disclaimer, the term of this patent is extended or adjusted under 35 U.S.C. 154(b) by 297 days.

(21) Appl. No.: 13/029,101

(22) Filed: Feb. 16, 2011

(65) Prior Publication Data
US 2012/0146003 A1 Jun. 14, 2012

(30) Foreign Application Priority Data
Dec. 9, 2010 (TW) .............................. 99223884 U

(51) Int. Cl.
*H01L 29/812* (2006.01)

(52) U.S. Cl. .................. 257/280; 257/E29.32

(58) Field of Classification Search .................. None
See application file for complete search history.

(56) References Cited

U.S. PATENT DOCUMENTS
7,649,217 B2   1/2010   Takshi et al.

FOREIGN PATENT DOCUMENTS
JP   10209429 A  *  8/1998
TW   200903810      1/2009

OTHER PUBLICATIONS

Kang, Min-Gu et al., Interface-controlled gate of GaAs metal-semiconductor field-effect transistor, p. 2499-2501, Apr. 2002.
Yasuyuki Watanabe et al., Improvement in On/Off ratio of pentacene static induction transistors by controlling hole injection barrier, p. 2717-2721, Apr. 24, 2007.
Min Suk Oh et al., Flexible high gain complementary inverter using n-ZnO and p-pentacene channels on polyethersulfone substrate, p. 033510-1-p. 033510-3, Jul. 22, 2008.

* cited by examiner

*Primary Examiner* — Wensing Kuo
(74) *Attorney, Agent, or Firm* — Winston Hsu; Scott Margo

(57) ABSTRACT

A thin film transistor having Schottky barrier includes a substrate, a first gate conductive layer formed on the substrate, a first semiconductor layer having a first conductive type formed on the first gate conductive layer, a source conductive layer and a drain conductive layer electrically isolated from each other and positioned on the first semiconductor layer, a second semiconductor layer having a second conductive type formed on the source conductive layer and the drain conductive layer, and a second gate conductive layer formed on the second semiconductor layer. The first conductive type is complementary to the second conductive type.

20 Claims, 7 Drawing Sheets

THIN FILM TRANSISTOR HAVING SCHOTTKY BARRIER

BACKGROUND OF THE INVENTION

1. Field of the Invention

This invention relates to a thin film transistor (TFT), and more particularly, to a TFT having Schottky barrier.

2. Description of the Prior Art

An integrated circuit (IC) is constructed by numberless field effect transistors (FETs). And there are always ongoing efforts in the semiconductor industry to improve the device performance of FETs and to reduce the power consumption of FETs.

For example, Schottky diode's voltage drop at a forward bias of about 1 mA is in the rage of 0.15 V to 0.45 V, while the conventional silicon diode is of about 0.6 V. Therefore the prior art has developed to integrate the Schottky diode to a FET because Schottky barrier is more preferable in voltage-clamping applications and in applications for preventing transistor saturation.

Since an optimum TFT structure integrated with Schottky barrier has not been developed, a TFT having Schottky barrier is still in need.

SUMMARY OF THE INVENTION

It is one of the objectives of the present invention to provide a TFT having Schottky barrier.

According to an aspect of the present invention, a TFT having Schottky barrier is provided. The TFT includes a substrate, a first gate conductive layer formed on the substrate, a first semiconductor layer having a first conductivity type formed on the first gate conductive layer, a source conductive layer and a drain conductive layer electrically isolated from each other and positioned on the first semiconductor layer, a second semiconductor layer having a second conductivity type formed on the source conductive layer and the drain conductive layer, and a second gate conductive layer formed on the second semiconductor layer. The first conductivity type is complementary to the second conductivity type.

According to the TFT having Schottky barrier provided by the present invention, the Schottky barriers formed by the first gate conductive layer and the first semiconductor layer, and by the second gate conductive layer and the second semiconductor layer are provided to replace the conventional gate dielectric layer used in a metal-oxide-semiconductor (MOS) transistor, therefore a TFT structure that is able to be turned on by smaller voltages is obtained. Furthermore, since the first semiconductor layer and the second semiconductor layer include conductivity types complementary to each other, polarities of the TFT are alterable according to the applied voltage. Accordingly, the TFT having Schottky barrier of the present invention provides much wider applications.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ".

Figure 1:
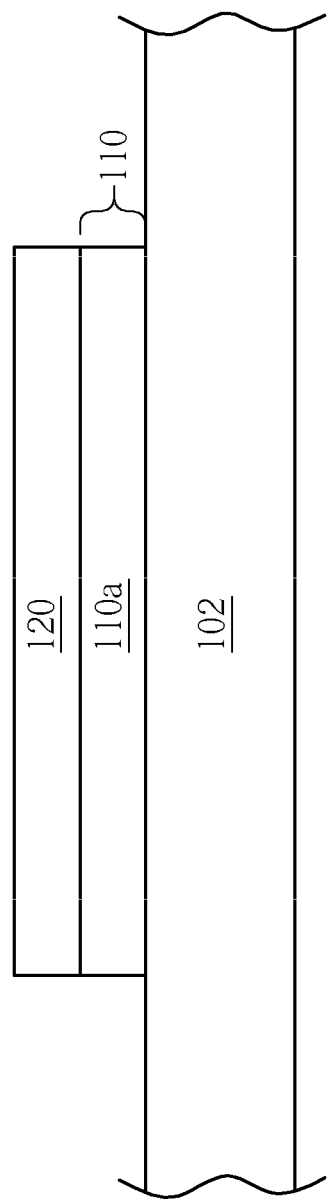
FIGS. 1-5 are drawings illustrating a method for manufacturing a TFT having Schottky barrier provided by a preferred embodiment of the present invention.

Please refer to FIGS. 1-5, which are drawings illustrating a method for manufacturing a TFT having Schottky barrier provided by a preferred embodiment of the present invention. As shown in FIG. 1, the preferred embodiment first provides a substrate 102, the substrate 102 includes glass substrate, quartz substrate, or plastic substrate, but not limited to this. The substrate 102 is cleaned by conventional dry or wet cleaning methods, surface treatments such as oxygen plasma treatment, or ultraviolet (UV) treatment in order to remove low density contaminants from the surface of the substrate 102. Thus the substrate 102 obtains a clean surface that improves film formation result.

Next, a first gate mask pattern (not shown) is formed on the substrate 102, and a vacuum evaporation process is performed to form a first gate conductive layer 110 on the substrate 102. Subsequently, a first semiconductor layer 120 is in-situ formed on the first gate conductive layer 110. The first semiconductor layer 120 includes a first conductivity type, and a thickness of the first semiconductor layer 120 is between 400 angstroms (Å) and 600 Å, but not limited to this. In the preferred embodiment, the first conductivity type is a p-type, and the first semiconductor layer 120 can include p-type low polymer organic semiconductor material that is more preferably formed by the evaporation process. The p-type low polymer organic semiconductor material exemplarily includes pentacene, tetracene, anthracene, or phthalocyanine. However, it will be appreciated by those of ordinary skill in the art that the first semiconductor layer 120 also can include p-type high polymer organic semiconductor material such as poly (3-Hexylthiophene) (P3HT).

The first gate conductive layer 110 includes metal or metal oxide. It is noteworthy that the first gate conductive layer 110 and the first semiconductor layer 120 form a Schottky barrier. To prevent electrons from crossing over the Schottky barrier and to prevent signals from passing through and missing from the first gate conductive layer 110, the first gate conductive layer 110 provided by the preferred embodiment preferably includes a low work function metal, and an energy gap between the low work function metal and the first semiconductor layer 120 is larger than 3 eV. For example, the first gate conductive layer 110 provided by the preferred embodiment exemplarily includes a Schottky metal layer 110a contacting the first semiconductor layer 120, and the Schottky metal layer 110a includes metal materials such as calcium (Ca), aluminum (Al), or magnesium (Mg) which have an energy gap larger than 3 eV between itself and the first semiconductor layer 120.

Figure 2:
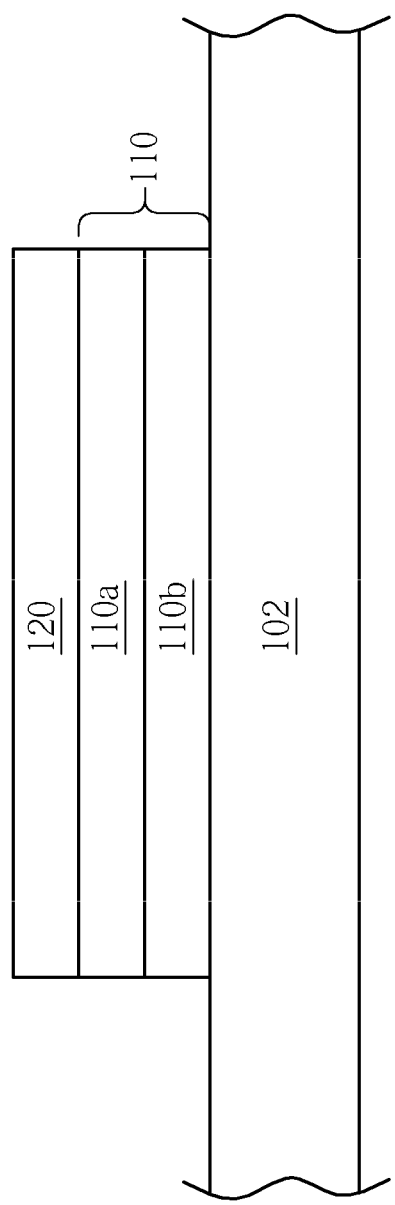

To further reduces adverse effects on the mobility of the single-layered Schottky metal layer 110a from the film formation process and the film formation characteristics, the first gate conductive layer 110 provided by the preferred embodiment further includes a multi-layered conductive layer as shown in FIG. 2. As shown in FIG. 2, the multi-layered conductive layer includes at least a metal layer contacting the first semiconductor layer 120, and an energy gap between the metal layer and the first semiconductor layer 120 is larger than 3 eV. The metal layer 110a exemplarily includes Ca. The metal layer 110a contacts the first semiconductor layer 120 and thus serves as a Schottky metal layer 110a. The multi-layered conductive layer further includes low work function metal or metal oxide layer such as gold (Au), silver (Ag), aluminum (Al), copper (Cu), or indium tin oxide (ITO). The abovementioned metal layer or metal oxide layer is provided to obviate unexpected adverse impacts such as uneven thickness when forming the Ca layer. Those skilled in the art should easily realize that the metal materials as mentioned above are exemplarily disclosed, and the first gate conductive layer 110 provided by the preferred embodiment can include any single-layered or multi-layered suitable metal layer or metal oxide layer that has the energy gap larger than 3 eV between itself and the first semiconductor layer 120. More important, the metal layer or the metal oxide layer having the energy gap larger than 3 eV between itself and the first semiconductor layer 120 is formed to contact the first semiconductor layer 120 and thus serves as the Schottky metal layer 110a.

It is also noticeable that the first gate conductive layer 110 and the first semiconductor layer 120 are sequentially formed on the substrate 102 by the vacuum evaporation processes according to the preferred embodiment, and the first semiconductor layer 120 and the first gate conductive layer 110 are formed in-situ. Consequently, the first semiconductor layer 120 protects the first gate conductive layer 110 from contacting the air and from forming any oxide that renders adverse impacts to electrical performance when removing the vacuum condition.

Figure 3:
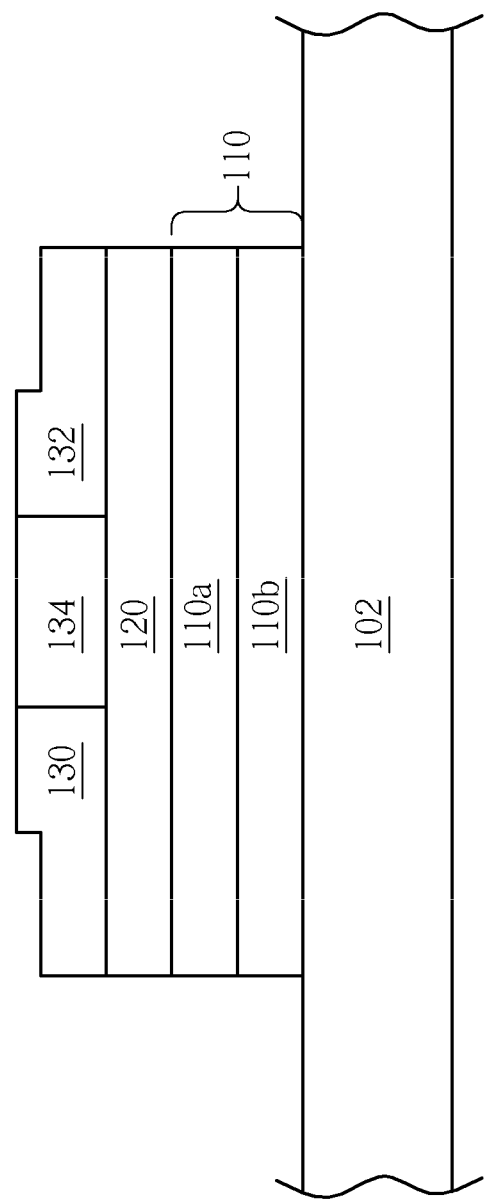

Please refer to FIG. 3. Next, the first gate mask pattern is removed and followed by forming a source/drain mask pattern (not shown) on the substrate 102. Then, another vacuum evaporation process is performed to form a source conductive layer 130 and a drain conductive layer 132 on the first semiconductor layer 120. As shown in FIG. 3, the source conductive layer 130 and the drain conductive layer 132 are spaced and electrically isolated from each other. Different from the first gate conductive layer 110, the source conductive layer 130 and the drain conductive layer 132 are used to provide Ohmic contacts while the first gate conductive layer 110 is used to provide Schottky contact. Therefore, any suitable metal or metal oxide materials that reduces contact resistance between the first semiconductor layer 120 and the source conductive layer 130 and the drain conductive layer 132, such as Au, Ag, Al, Cu or ITO, can be used to form the source conductive layer 130 and the drain conductive layer 132 of the preferred embodiment, but not limited to this.

Please still refer to FIG. 3. After forming the source conductive layer 130 and the drain conductive layer 132, a dielectric layer 134 is in-situ formed on the first semiconductor layer 120 between the source conductive layer 130 and the drain conductive layer 132. As shown in FIG. 3, the dielectric layer 134 is formed between the source conductive layer 130 and the drain conductive layer 132 horizontally for electrically isolating the source conductive layer 130 from the drain conductive layer 132. The dielectric layer 134 includes dielectric materials well-known in the semiconductor manufacturing processes such as silicon oxide, silicon nitride, or silicon oxynitride, but not limited to this.

Figure 4:
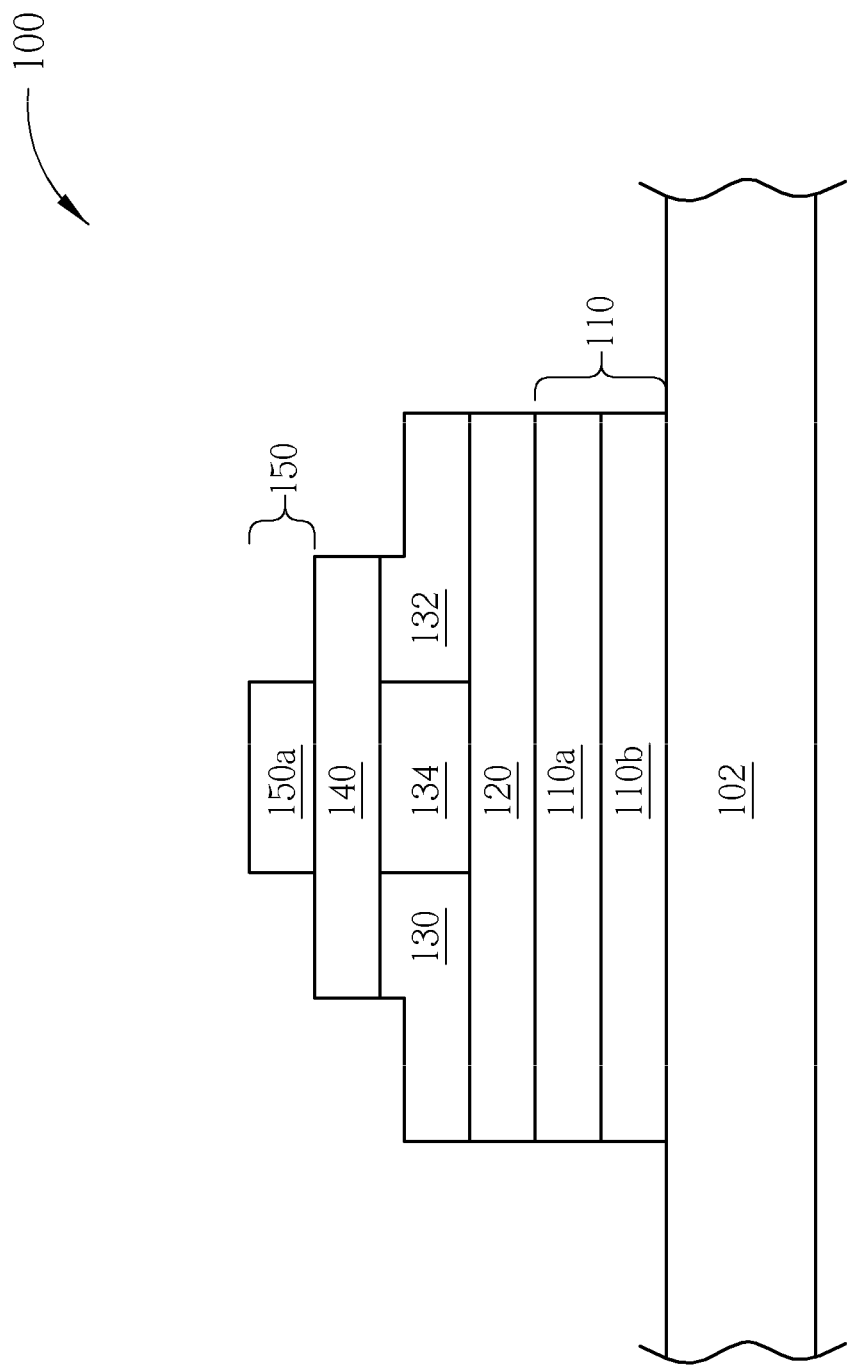

Please refer to FIG. 4. Next, the source/drain mask pattern and the vacuum condition are removed, and followed by forming a second gate mask pattern (not shown) on the substrate 102. After forming the second gate mask pattern, a vacuum evaporation process is performed to form a second semiconductor layer 140 on the source conductive layer 130, the dielectric layer 134 and the drain conductive layer 132.

Then, a second gate conductive layer 150 is in-situ or ex-situ formed on the second semiconductor layer 140. The second semiconductor layer 140 includes a second conductivity type, and a thickness of the second semiconductor layer 140 is between 400 Å and 600 Å. The second conductivity type is complementary to the first conductivity type; accordingly the second conductivity type is an n-type in the preferred embodiment. In the preferred embodiment, the second semiconductor layer 140 can include n-type low polymer organic semiconductor material that is more preferably formed by the evaporation process. The n-type low polymer organic semiconductor material exemplarily includes fullerene. However, it will be appreciated by those of ordinary skill in the art that the second semiconductor layer 140 also can include n-type low polymer organic semiconductor material such as phenyl-$C_{61}$-butyric-acid-methyl-ester (PCBM) or inorganic semiconductor material such as indium gallium zinc oxide (IGZO), indium zinc oxide (IZO) or zinc oxide (ZnO), but not limited to this.

As mentioned above, the second gate conductive layer 150 and the second semiconductor layer 140 form a Schottky barrier. To prevent electrons from crossing over the Schottky barrier and to prevent signals from passing through and missing from the second gate conductive layer 150, the second gate conductive layer 150 provided by the preferred embodiment preferable includes a low work function metal, and an energy gap between the low work function metal and the second semiconductor layer 140 is larger than 3 eV. For example, the second gate conductive layer 150 provided by the preferred embodiment exemplarily includes a Schottky metal layer 150a contacting the second semiconductor layer 140, and the Schottky metal layer 150a includes metal materials such as Al, Mg, or preferably Ca, which have an energy gap larger than 3 eV between itself and the second semiconductor layer 140.

Figure 5:
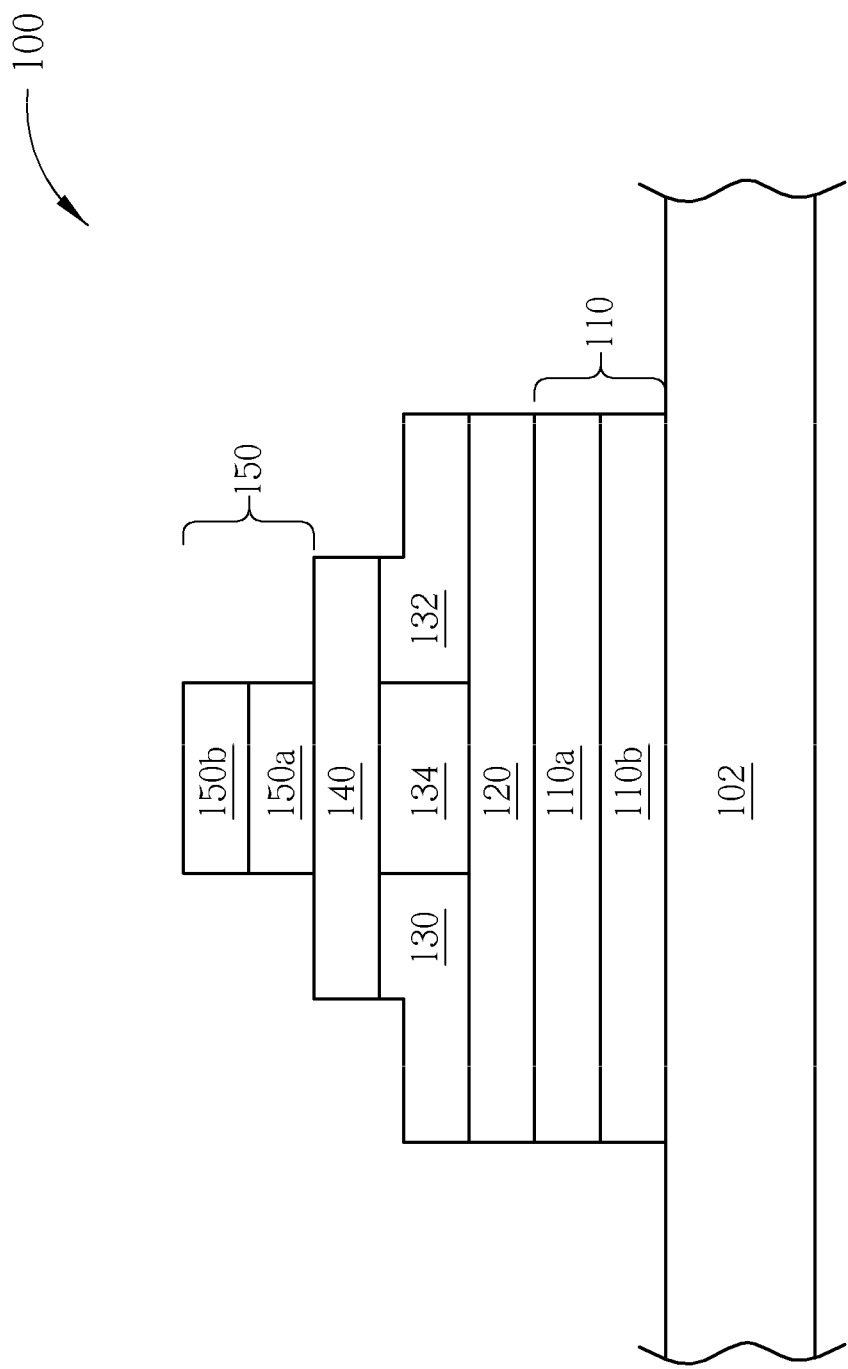

Furthermore, to reduces adverse effects on the mobility of the single-layered Schottky metal layer 150a from the film formation process and the film formation characteristics, the second gate conductive layer 150 provided by the preferred embodiment further includes a multi-layered conductive layer as shown in FIG. 5. As shown in FIG. 5, the multi-layered conductive layer includes at least a metal layer contacting the second semiconductor layer 140, and an energy gap between the metal layer and the second semiconductor layer 140 is larger than 3 eV. The metal layer 150a exemplarily includes Ca or Al. And the metal layer 150a contacts the second semiconductor layer 140 and thus serves as a Schottky metal layer 150a. The multi-layered conductive layer further includes a low work function metal layer or a metal oxide layer such as Au, Ag, Al, Cu or ITO. The abovementioned metal layer or metal oxide layer is provided to obviate unexpected adverse impacts such as uneven thickness when forming the Ca layer. Those skilled in the art should easily realize that the metal materials as mentioned above are exemplarily disclosed, and the second gate conductive layer 150 provided by the preferred embodiment can include any single-layered or multi-layered suitable metal layer or metal oxide layer that has the energy gap larger than 3 eV between itself and the second semiconductor layer 140. More important, the metal layer or the metal oxide layer having the energy gap larger than 3 eV between itself and the second semiconductor layer 140 is formed to contact the second semiconductor layer 140 and thus serves as the Schottky metal layer 150a. As shown in FIG. 4 and FIG. 5, consequently a TFT 100 having Schottky barrier is obtained after forming second gate conductive layer 150.

Figure 6:
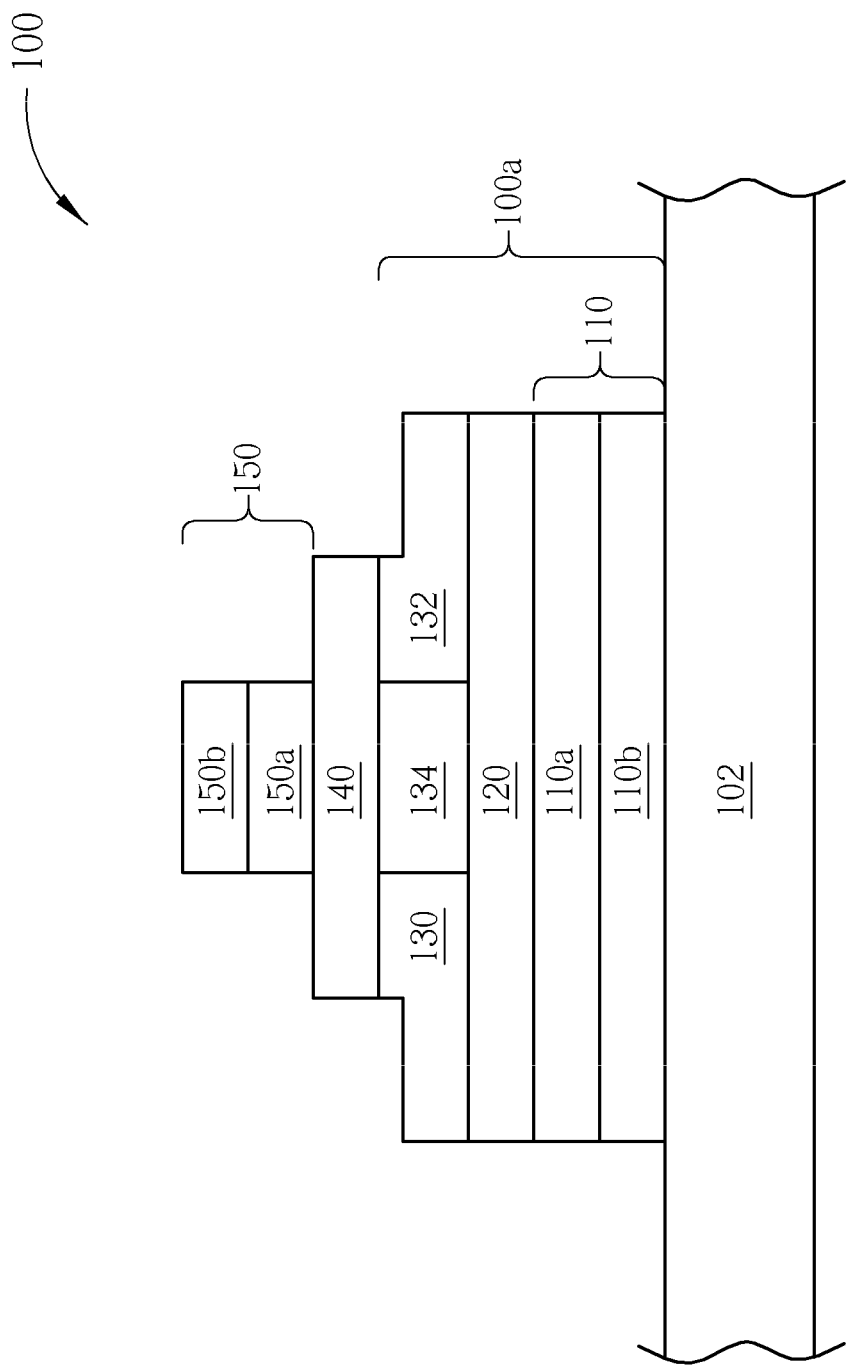
FIGS. 6-7 are drawings illustrating the TFT having Schottky barrier in different operations.
Figure 7:
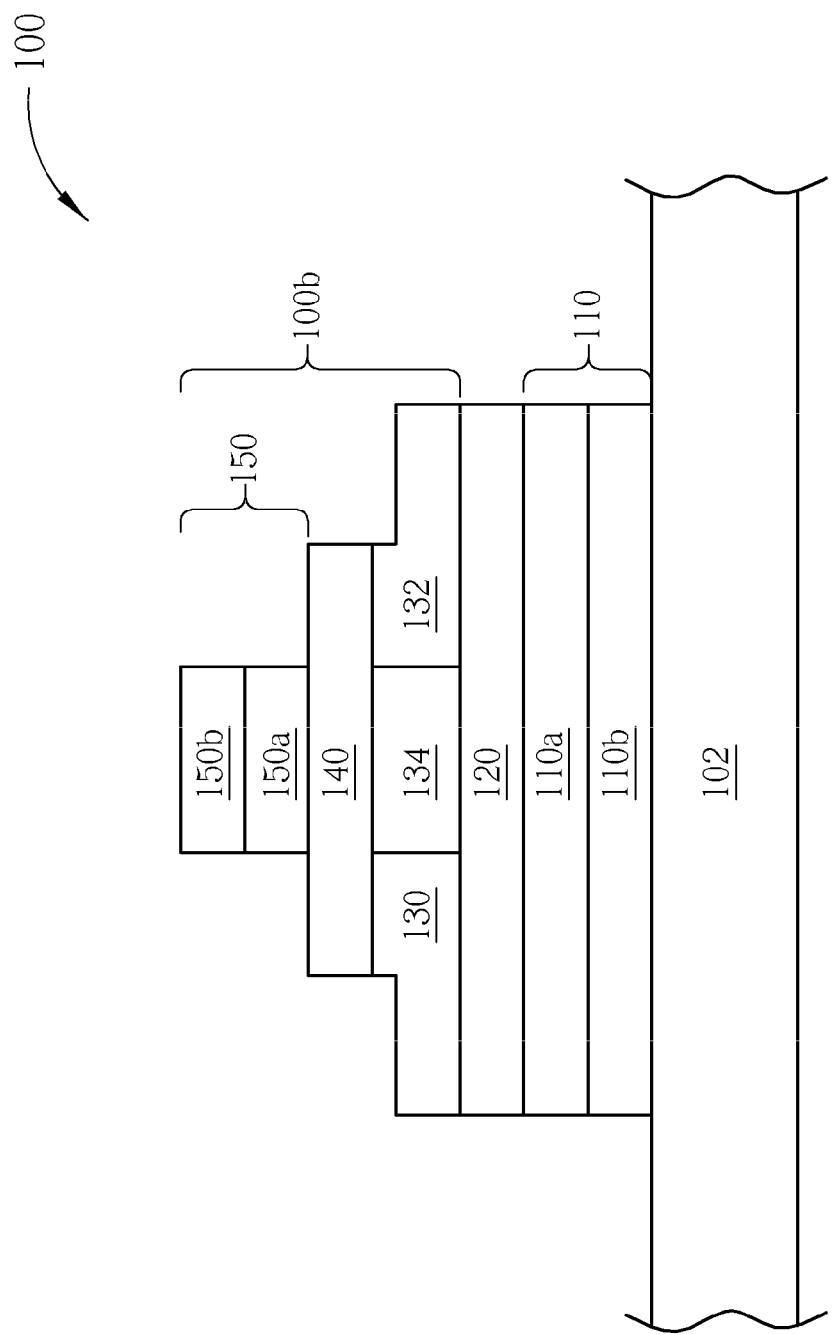

Please refer to FIGS. 6-7, which are drawings illustrating the TFT 100 having Schottky barrier in different operations. It is noteworthy that the TFT 100 having Schottky barrier of the present invention is a double-gate TFT. In detail, the first gate conductive layer 110, the first semiconductor layer 120, the source conductive layer 130, and the drain conductive layer 132 form a first TFT 100a as shown in FIG. 6. In the preferred embodiment the first TFT 100a is a p-type TFT. The second gate conductive layer 150, the second semiconductor layer 140, the source conductive layer 130, and the drain conductive layer 132 form a second TFT 100b as shown in FIG. 7. In the preferred embodiment, the second TFT 100b is an n-type TFT. The first TFT 100a and the second TFT 100b share the source conductive layer 130 and the drain conductive layer 132. As shown in FIG. 6, the Schottky barrier provided by the first gate conductive layer 110 and the first semiconductor layer 120 replaces the gate dielectric layer of a conventional p-type metal-oxide-semiconductor (PMOS) transistor according to the preferred embodiment. Therefore, the first TFT 100a is turned on by lower negative voltages. In the same concept, the Schottky barrier provided by the second gate conductive layer 150 and the second semiconductor layer 140 replaces the gate dielectric layer of a conventional NMOS transistor. Therefore the second TFT 100b is turned on by lower positive voltages. According to the preferred embodiment, the first TFT 100a and the second TFT 100b can be respectively turned on by lower voltages, therefore the TFT 100 having Schottky barrier provided by the present invention improves switch speed, reduces power consumption, alleviates gate-leakage problem, and prevents transistor saturation. Furthermore, by altering inputted external voltages, the polarities of the TFT 100 are alterable, which means by providing positive or negative voltages, the second TFT 100a and the first TFT 100b are alternatively turned on or turned off. The TFT 100 having Schottky barrier provided by the present invention includes the dielectric layer 134 vertically between the first semiconductor layer 120 and the second semiconductor layer 140, therefore the channels of complementary polarities are isolated, and mutual effects to the first TFT 100a and the second TFT 100b are prevented.

According to the TFT having Schottky barrier provided by the present invention, the Schottky barriers formed by the first gate conductive layer and the first semiconductor layer, and by the second gate conductive layer and the second semiconductor layer are provided to replace the gate dielectric layer conventionally used in a metal-oxide-semiconductor (MOS) transistor, therefore a TFT structure that is able to be turned on by smaller voltages is obtained. Furthermore, since the first semiconductor layer and the second semiconductor layer include conductivity types complementary to each other, polarities of the TFT are alterable according to the applied voltage. Accordingly, the TFT having Schottky barrier of the present invention provides much wider applications. For example, the TFT having Schottky barrier provided by the present invention can serve as a pixel switch device used in liquid crystal display (LCD) panel.

Those skilled in the art will readily observe that numerous modifications and alterations of the device and method may be made while retaining the teachings of the invention.

What is claimed is:

1. A thin film transistor (TFT) having Schottky barrier, comprising: a substrate;
   a first gate conductive layer formed on the substrate;
   a first semiconductor layer having a first conductivity type formed on the first gate conductive layer;
   a source conductive layer and a drain conductive layer electrically isolated from each other and positioned on the first semiconductor layer;
   a second semiconductor layer having a second conductivity type formed on the source conductive layer and the drain conductive layer, the second conductivity type being complementary to the first conductivity type; and
   a second gate conductive layer formed on the second semiconductor layer.

2. The TFT having Schottky barrier according to claim 1, wherein the first gate conductive layer comprises a single metal layer or a multi-layered conductive layer.

3. The TFT having Schottky barrier according to claim 2, wherein the single metal layer contacts the first semiconductor layer and comprises a metal material, and an energy gap between the metal material and the first semiconductor layer is larger than 3 eV.

4. The TFT having Schottky barrier according to claim 3, wherein the single metal layer comprises calcium (Ca), aluminum (Al), or magnesium (Mg).

5. The TFT having Schottky barrier according to claim 2, wherein the multi-layered conductive layer comprises at least a metal layer contacting the first semiconductor layer, and an energy gap between the metal layer and the first semiconductor layer is larger than 3 eV.

6. The TFT having Schottky barrier according to claim 5, wherein the metal layer comprises Ca, Al or Mg.

7. The TFT having Schottky barrier according to claim 1, wherein the second gate conductive layer comprises a single metal layer or a multi-layered conductive layer.

8. The TFT having Schottky barrier according to claim 7, wherein the single metal layer contacts the second semiconductor layer and comprise a metal material, and an energy gap between the metal material and the second semiconductor layer is larger than 3 eV.

9. The TFT having Schottky barrier according to claim 8, wherein the single metal layer comprises Ca, Al or Mg.

10. The TFT having Schottky barrier according to claim 7, wherein the multi-layered conductive layer comprises at least a metal layer contacting the second semiconductor layer, and an energy gap between the metal layer and the second semiconductor layer is larger than 3 eV.

11. The TFT having Schottky barrier according to claim 10, wherein the metal layer comprise Ca, Al or Mg.

12. The TFT having Schottky barrier according to claim 1, wherein a thickness of the first semiconductor layer and the second semiconductor layer is between 400 angstroms (Å) and 600 Å.

13. The TFT having Schottky barrier according to claim 1, wherein the first semiconductor layer further comprises a p-type low polymer organic semiconductor material or a p-type high polymer organic semiconductor material.

14. The TFT having Schottky barrier according to claim 13, wherein the p-type low polymer organic semiconductor material comprises pentacene, tetracene, anthracene, phthalocyanine, and the p-type high polymer organic semiconductor material comprises poly (3-Hexylthiophene) (P3HT).

15. The TFT having Schottky barrier according to claim 1, wherein the second semiconductor layer further comprises an n-type low polymer organic semiconductor material or an n-type inorganic semiconductor material.

16. The TFT having Schottky barrier according to claim 15, wherein the n-type low polymer organic semiconductor material comprises phenyl-$C_{61}$-butyric-acid-methyl-ester (PCBM), and the n-type inorganic semiconductor material comprises indium gallium zinc oxide (IGZO), indium zinc oxide (IZO), or zinc oxide (ZnO).

17. The TFT having Schottky barrier according to claim 1, further comprising a dielectric layer formed between the source conductive layer and the drain conductive layer for electrically isolating the source conductive layer from the drain conductive layer.

18. The TFT having Schottky barrier according to claim 17, wherein the dielectric layer further comprises silicon oxide, silicon nitride, or silicon oxynitride.

19. The TFT having Schottky barrier according to claim 1, wherein the first gate conductive layer, the first semiconductor layer, the source conductive layer, and the drain conductive layer form a first TFT, the second gate conductive layer, the second semiconductor layer, the source conductive layer, and the drain conductive layer form a second TFT, and the first TFT and the second TFT respectively include a conductivity type that complementary to each other.

20. The TFT having Schottky barrier according to claim 19, wherein the first TFT and the second TFT share the source conductive layer and the drain conductive layer.

\* \* \* \* \*